(12) United States Patent
Lee et al.

(10) Patent No.: US 7,412,669 B1
(45) Date of Patent: Aug. 12, 2008

(54) GENERATION OF GRAPHICAL DESIGN REPRESENTATION FROM A DESIGN SPECIFICATION DATA FILE

(75) Inventors: Fung Fung Lee, Milpitas, CA (US); Chukwuweta Chukwudebe, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 262 days.

(21) Appl. No.: 11/483,239

(22) Filed: Jul. 6, 2006

(51) Int. Cl.
  *G06F 17/50* (2006.01)
  *G06F 9/45* (2006.01)
(52) U.S. Cl. ............................................. 716/1; 716/8
(58) Field of Classification Search ................... 716/1, 716/8
  See application file for complete search history.

(56) References Cited

U.S. PATENT DOCUMENTS

| | | | |
|---|---|---|---|
| 6,189,061 B1 * | 2/2001 | Katz et al. ................. | 710/110 |
| 6,772,254 B2 * | 8/2004 | Hofmann et al. ............ | 710/110 |
| 6,917,998 B1 * | 7/2005 | Giles .......................... | 710/300 |
| 7,032,061 B2 * | 4/2006 | Huch et al. ................. | 710/316 |
| 7,145,903 B2 * | 12/2006 | Gutierrez .................... | 370/362 |

OTHER PUBLICATIONS

U.S. Appl. No. 11/405,894, filed Apr. 18, 2006, Tetzlaff.

* cited by examiner

*Primary Examiner*—Stacy A Whitmore
*Assistant Examiner*—Magid Y Dimyan
(74) *Attorney, Agent, or Firm*—LeRoy D. Maunu

(57) ABSTRACT

Method and apparatus are described for generating a block diagram of an electronic circuit design. In one embodiment, each instance of a multi-master bus, a bus master of a multi-master bus, a bus slave of a multi-master bus, a memory, a co-processor and an input/output port is are identified. Instances of input/output ports are placed about a perimeter of a first area of the diagram. Each instance of a multi-master bus is placed in a bus area within the first area and each bus master is placed in a master area. The bus slaves of a bus are collected in a group, and the group is placed as a single block in a slave area within the first area. The group of bus slave slaves is aligned with a bus master. A diagrammatic representation is output consistent with the placement representations.

20 Claims, 7 Drawing Sheets

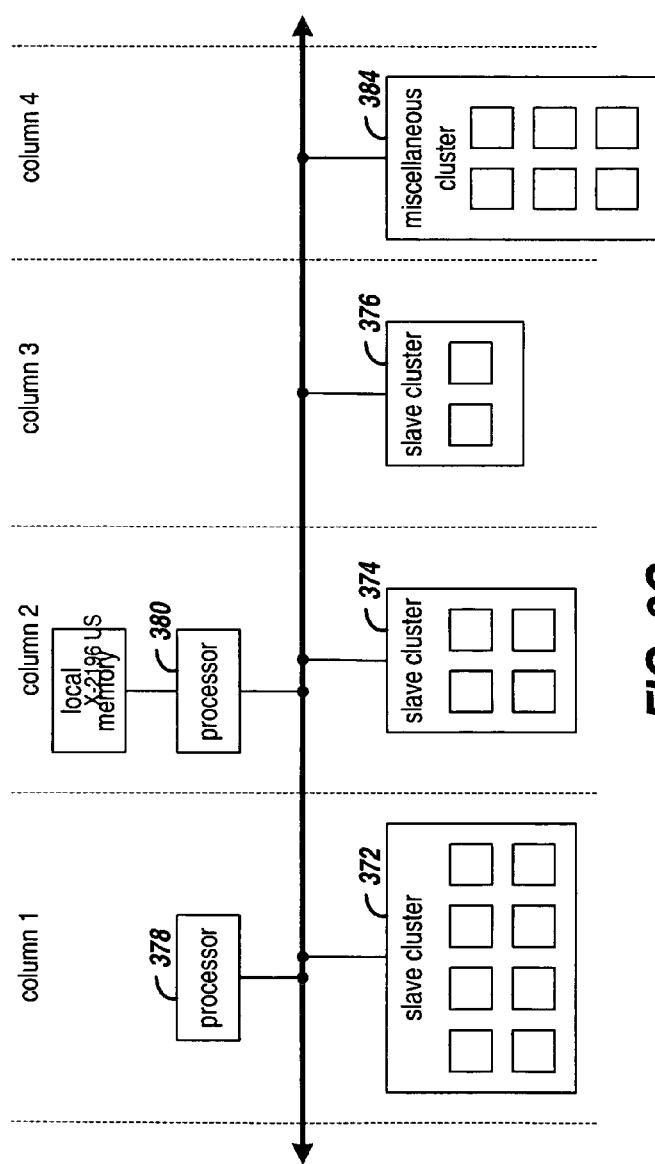

GENERATION OF GRAPHICAL DESIGN REPRESENTATION FROM A DESIGN SPECIFICATION DATA FILE

FIELD OF THE INVENTION

The present invention generally relates to generating a graphical representation from an electronic design specification data file.

BACKGROUND

Electronic circuit designs are commonly specified using language-based descriptions. For example, various hardware description languages (HDLs) are available for specifying a design. To aid in quickly preparing a design, pre-defined libraries of modules provide building blocks, which may be selected and integrated with application-specific logic.

An example language-based design entry tool is the Xilinx Platform Studio, which uses a set of text files to model a design at a system level. For example, a bus abstraction hides the details of the many signals involved in interconnecting the bus arbiters, the block components, and various multiplexers that would appear in a low-level implementation description. The Xilinx Platform Studio provides the capability to link together HDL library modules into a system with a tool-specific language.

In some instances, a graphical representation of a design may be more useful than the textual specification. A graphical representation may provide feedback to the designer for verification that the language-based description specifies the intended design. In addition, a graphical representation may be used to effectively communicate aspects of the design between members of a system design team.

The graphical representation of a design often is of the low-level implementation of the design. The low-level representation, however, may obscure useful high-level design information with low-level details. For example, in complex designs with a high number of interconnects the sheer number of interconnections can make it difficult to trace the basic connections between functional blocks.

The present invention may address one or more of the above issues.

SUMMARY OF THE INVENTION

The invention provides various embodiments for generating a block diagram of an electronic circuit design. In one embodiment, a processor-based method is provided, and the method includes identifying by the a processor from an input textual description of the electronic circuit design, each instance of a multi-master bus, a bus master of a multi-master bus, a bus slave of a multi-master bus, a memory, a co-processor and an input/output port. Diagrammatic placement of the instances of input/output ports about a perimeter of a first area are represented in a memory coupled to the processor. A bus area, a master area, and a slave area are represented within the first area. Placement in the bus area of each instance of a multi-master bus is represented in the memory, as is placement in the master area of each instance of a bus master of a multi-master bus. No instance of a bus master is placed between another instance of a bus master and a multi-master bus. A group of instances of bus slaves of a multi-master bus is represented in the memory; each instance of a bus slave in the group having a slave connection to the multi-master bus and no other connection to a bus master of the multi-master bus. The placement of the group of instances of bus slaves is represented as a single block in the bus area, and the group is diagrammatically aligned with an instance of a bus master of the multi-master bus to which the group of bus slaves is connected. Connections are represented with connection lines, and a diagrammatic representation is output consistent with the representations of the placement of each instance of the identified multi-master bus, bus master, bus slave, and connections.

In another embodiment, and apparatus is provided for generating a block diagram of an electronic circuit design. The apparatus includes means for identifying from an input textual description of the electronic circuit design, each instance of a multi-master bus, a bus master of a multi-master bus, a bus slave of a multi-master bus, and an input/output port; means for representing diagrammatic placement of the instances of input/output ports about a perimeter of a first area; means for representing a bus area, a master area, and a slave area within the first area; means for representing in the memory, placement in the bus area of each instance of a multi-master bus; means for representing placement in the master area of each instance of a bus master of a multi-master bus, wherein no instance of a bus master is placed between another instance of a bus master and a multi-master bus; means for representing a group of instances of bus slaves of a multi-master bus, wherein each instance of a bus slave in the group has a slave connection to the multi-master bus and no other connection to a bus master of the multi-master bus; means for representing placement of the group of instances of bus slaves as a single block in the bus area, wherein the group is diagrammatically aligned with an instance of a bus master of the multi-master bus to which the group of bus slaves is connected; means for representing connections between each instance of a multi-master bus and each instance of a bus master of the multi-master bus and a connection between the multi-master bus and the group of bus slaves with connection lines; and means for outputting a diagrammatic representation consistent with the representations of the placement of each instance of the identified multi-master bus, bus master, bus slave, and connections.

Yet another embodiment provides an article of manufacture. The article of manufacture includes a processor-readable medium configured with instructions executable by a processor for generating a block diagram of an electronic circuit design by performing steps including, identifying by the processor from an input textual description of the electronic circuit design, each instance of a multi-master bus, a bus master of a multi-master bus, a bus slave of a multi-master bus, and an input/output port; representing in a memory coupled to the processor, diagrammatic placement of the instances of input/output ports about a perimeter of a first area; representing in the memory, a bus area, a master area, and a slave area within the first area; representing in the memory, placement in the bus area of each instance of a multi-master bus; representing in the memory, placement in the master area of each instance of a bus master of a multi-master bus, wherein no instance of a bus master is placed between another instance of a bus master and a multi-master bus; representing in the memory, a group of instances of bus slaves of a multi-master bus, wherein each instance of a bus slave in the group has a slave connection to the multi-master bus and no other connection to a bus master of the multi-master bus; representing in the memory, placement of the group of instances of bus slaves as a single block in the bus area, wherein the group is diagrammatically aligned with an instance of a bus master of the multi-master bus to which the group of bus slaves is connected; representing in the memory, connections between each instance of a multi-master bus and each instance of a bus master of the multi-master bus and a connection between the multi-master bus and the group of bus slaves with connection lines; and outputting a diagrammatic representation consistent with the representations of the placement of each instance of the identified multi-master bus, bus master, bus slave, and connections.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 3C shows an example graphical representation of an electrical circuit used by and resulting from the flow diagram of FIG. 3, according to an example embodiment of the present invention;

DETAILED DESCRIPTION

The various embodiments of the invention provide automatic generation of a system block diagram from a textual specification of an electronic circuit design.

Figure 1:
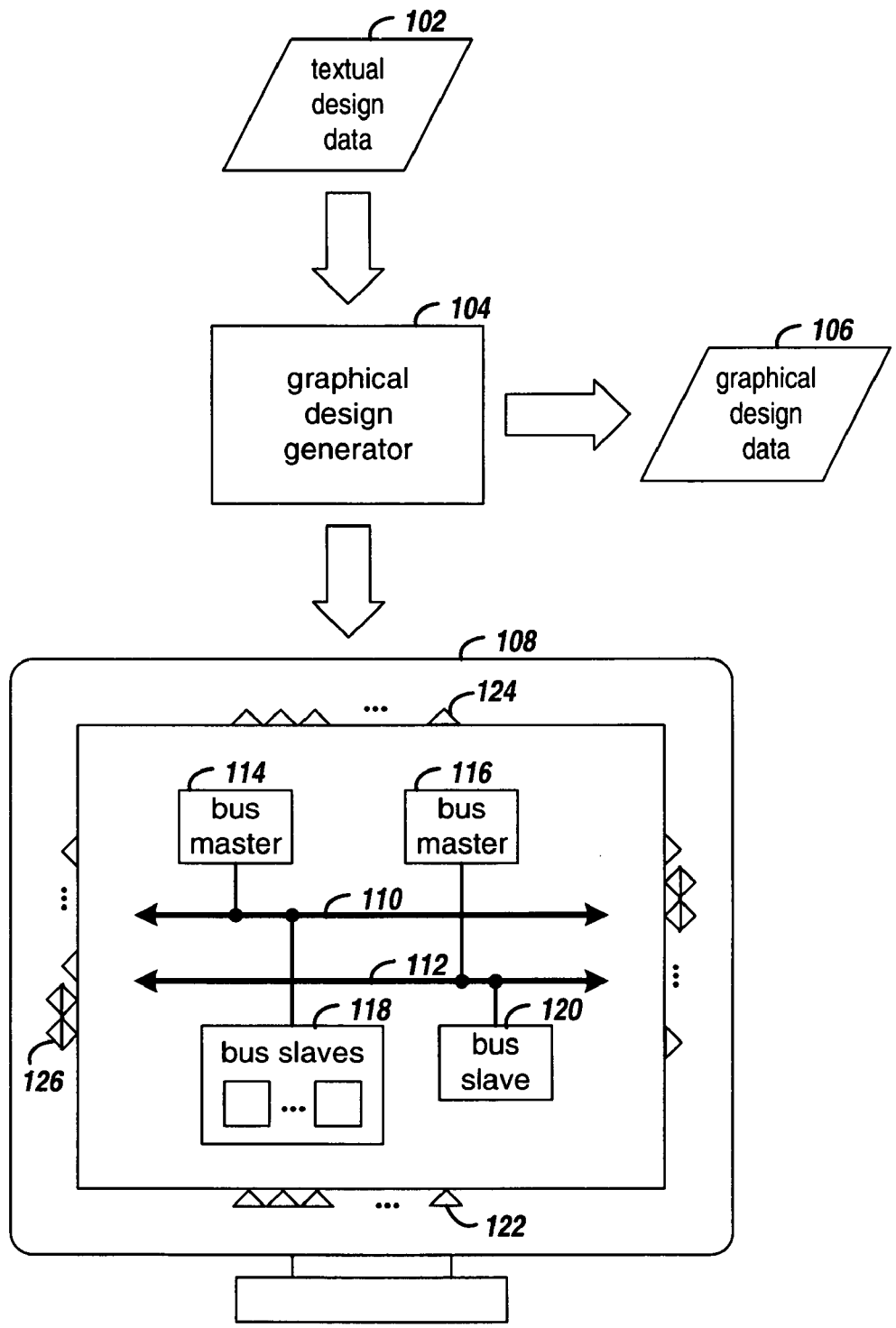
FIG. 1 shows an arrangement for creating a graphical representation of an electrical circuit and an example of such a graphical representation, according to an example embodiment of the present invention.

FIG. 1 is an example block diagram that illustrates the translation of a textual description of a design to a block diagram in accordance with an embodiment of the invention. Textual design data 102 is input to a graphical design generator 104. The textual design data describes instances of blocks, the interconnections between the blocks, and other details of the types of blocks. The output is graphics data 106 from which a system block diagram rendered. Example graphics formats include Scalable Vector Graphics (SVG) and Joint Picture Experts Group (JPEG) files. The output data may be output to a display 108 or be stored for subsequent use.

The generated system block diagram may be viewed as being bus-centric and processor-centric. Multi-master buses, for example 110 and 112, and bridges (not shown) in the design are displayed in the center of the diagram, bus masters, for example, 114 and 116, are displayed in the upper part of the diagram, and bus slaves, for example 118 and 120, are displayed in the lower part of the diagram. Input/output pins are displayed on the perimeter of the block diagram, for example input pin 122, output pin 124, and input-output pin 126. Other miscellaneous blocks of the design are also placed in the lower area of the display. In one embodiment, selected low-level details are completely omitted from the diagram. In another embodiment, selected low-level details are omitted from graphical representation in the diagram. For example, the distribution of clock nets may be shown as complementary text tables instead of graphically displayed in the diagram.

Textual design data 102 is used to identify the various classes of elements (masters, slaves, buses and bridges). Masters and slaves can be identified based upon the type of connections they have to a shared bus. For example, a master is identified as an element having one or more mastership type connections to the shared bus. Slaves will have only slave connections to the bus, and most often will have only a single such connection to any bus. The textual description of Buses, Bridges and other special types of design elements contain additional identification information used to describe the correct type of element. Textual design data 102 may take the form of any well known file formats used for electrical circuit design. In one embodiment, textual description 102 may include MHS (Microprocessor Hardware Specification) file(s) and MPD (Microprocessor Peripheral Definition) file(s).

Figure 2:
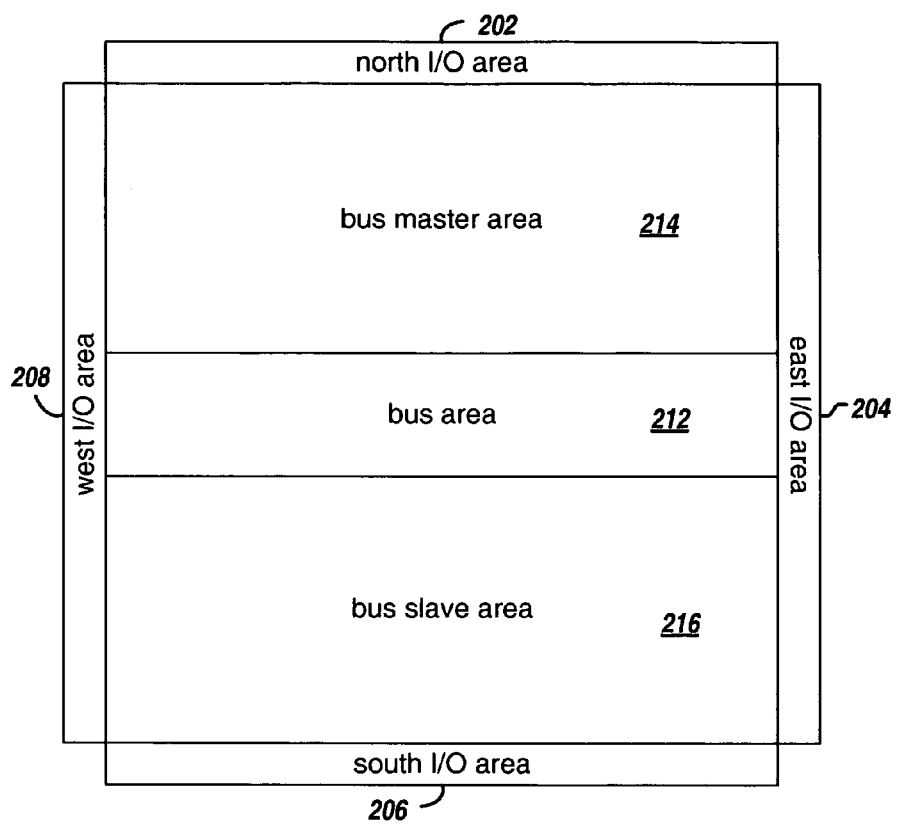
FIG. 2 shows an example implementation of a graphical representation of an electrical circuit, according to an example embodiment of the present invention.
Figure 3:
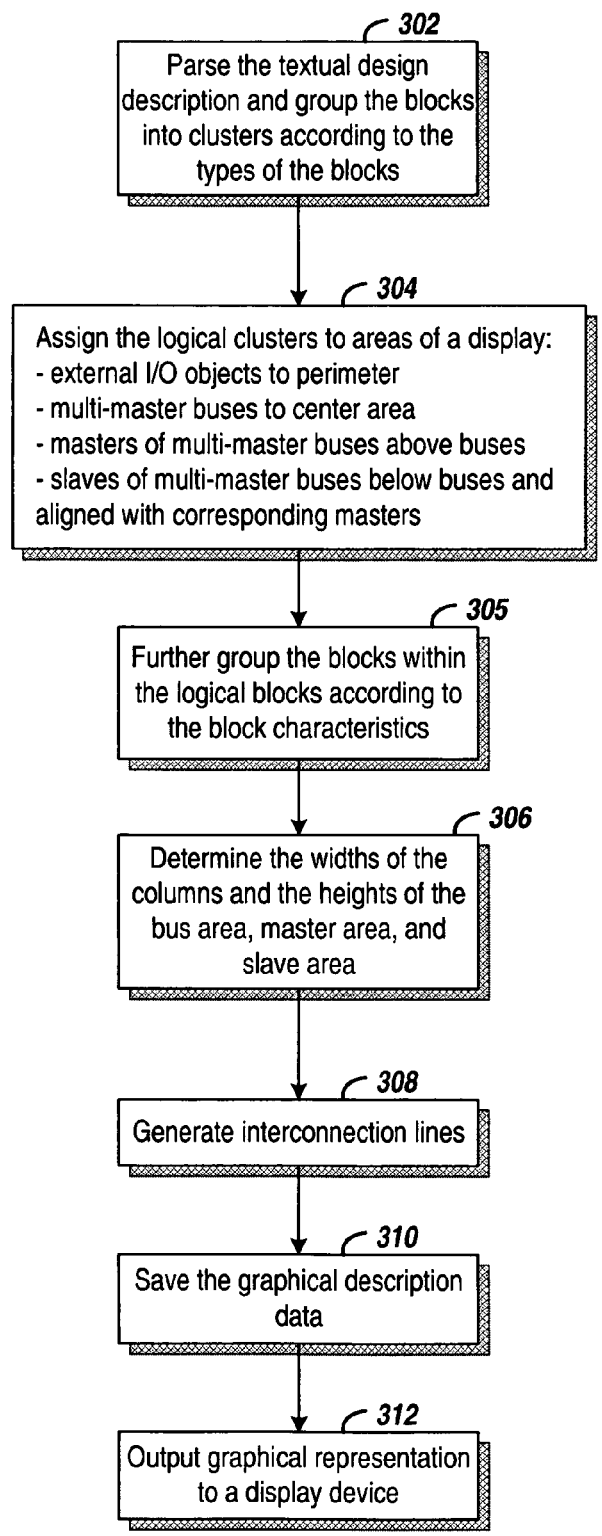
FIG. 3 shows a flow diagram for the creation of a graphical representation of an electrical circuit, according to an example embodiment of the present invention.

FIG. 2 shows an abstract view of the display areas in which the different types of design objects are placed for display. These general areas are used and referenced in the described process for generating a block diagram (FIG. 3). Input/output objects are placed in one of the four perimeter areas designated as north area 202, east area 204, south area 206, and west area 208. The bus area 212 is generally at the center of the diagram, with bus master area 214 above the bus area and bus slave area 216 below the bus area.

FIG. 3 is a flowchart of a process for generating a block diagram of an electronic circuit design from a textual description of the design in accordance with various embodiments of the invention. The process generally entails forming clusters of design objects of similar types, assigning display locations to the objects in the clusters, establishing sizes of the objects within the designated areas, and generating interconnection lines between the objects.

At step 302, the textual electronic circuit design description is input and parsed, and the textually-specified blocks are grouped into clusters according to the types of the blocks. In an example embodiment, the blocks are divided into five main clusters, multi-master bus masters, external I/O ports, multi-master bus slaves, multi-master buses and bridges, and miscellaneous items.

The various classes of elements, (masters, slaves, buses and bridges) are identified by referencing information stored in library definitions. Instances of masters and slaves are identified by the "mastership" of their connections to the bus. A master will have one or more connections to the shared bus, namely, that of mastership type "master" or "master_slave". Slaves will have only slave connections to the bus, and most often will have only a single such connection, in which case these slaves are represented clustered together into a single group with a single connection to the shared bus. Buses, bridges and other special types of design elements are identified by referencing a library definition.

Each instance of a master of a multi-master bus is grouped together along with its affiliates into a respective master cluster. Masters often are processors, but can also be user defined blocks that have a master connection to a shared bus. If the master is a processor, the cluster for that master includes the affiliates of the processor. An affiliate may be a local memory subsystem, which includes a local memory controller and a memory block, or a cluster of two local memory controllers and a shared memory block. An affiliate may also be a cluster of one or more co-processors. If the bus master is not a processor, then there are generally no affiliates of the bus master. Should a non-processor bus master have affiliates, those affiliates would be placed in a manner similar to that used to place processor affiliates.

External I/O ports are grouped into an I/O cluster. The I/O cluster is further divided into four I/O clusters. For example, one for each of the four I/O areas as is shown in FIG. 2. Within the four IO areas the ports are grouped according to the modules to which the ports are connected. IO ports that source more than one module are placed in an initial group marked as GBL. Subsequent groups represent sets of IO ports that source or are sourced by single modules. Each port in the diagram may be marked with a number that can be matched against an IO table (not shown) displayed below the block diagram to obtain information such as its width or special attributes. The port may also marked with a group letter that matches a letter drawn on the element within the block diagram.

Multi-master buses and associated bridges are grouped into a bus cluster. The bus cluster is further divided into two clusters, a bus cluster for the multi-master buses and a bridge cluster for the bridges. The division between buses and bridges in a cluster is used for placement of the buses and bridges for display purposes as is later described.

Multi-master bus slaves are grouped into a slave cluster. The slave cluster is further divided into physical slave clusters of related slaves. In an example embodiment, each slave cluster contains the slaves having the same set of bus connections. Examples of design objects that would be in a slave cluster include interrupt controllers, timers and UARTs. These typically have a single slave bus connection to a shared bus. A slave may be connected to more than one bus, but only to one "shared bus", (i.e. a bus within area 212). An example would be the opb_mdm module my_mdm in FIG. 4, which is connected to shared bus myopb_bus, and also to nonshared bus download_link.

The remaining blocks are grouped into a miscellaneous cluster. Typically, the blocks in the miscellaneous cluster are blocks that are not connected to a multi-master bus and are not affiliates of a master.

Once the blocks of the design have been grouped into clusters, the design objects may be assigned to areas shown in FIG. 2 (step 304). In one embodiment, each of the physical I/O clusters is assigned to one of the four I/O areas 202, 204, 206, and 208, clusters of buses and bridges are assigned to the bus area 212, master clusters are assigned to the bus master area 214, and slave clusters are assigned to the bus slave area 216.

At step 306, an approach for placing the objects of the clusters within the areas 212, 214 and 216 initially divides the spaces 212, 214, and 216 into m columns, where m is the number of master clusters.

Figure 3A:
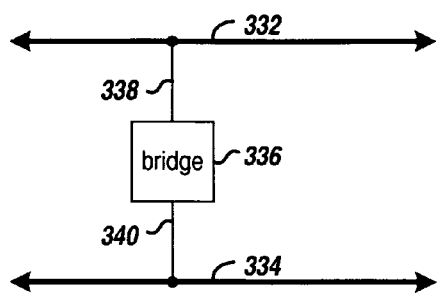
FIG. 3A shows an example graphical representation of an electrical circuit used by and resulting from the flow diagram of FIG. 3, according to an example embodiment of the present invention.

Buses and bridges are assigned to the bus area. As shown in FIG. 3A, buses 332 and 334 are represented with horizontal lines, and each bridge 336 is represented with a block that is connected to the buses with lines 338 and 340. Each bridge is placed immediately below the bus to which the bridge has a slave connection and Line 338 represents this connection. Line 340 represents the connection to the multi-master bus to which the bridge has a master connection, and can extend either up or down to connect to this bus. Alternatively, the bridge may be positioned below the two bus lines with the tradeoff being crossing of connection lines over the bus lines. The lines represent the buses may span the m columns, and the bridge blocks may be equally spaced over the m columns.

The master clusters are respectively assigned to the m columns. For example, a first cluster includes processor 352, local memory 354, and co-processor 356; a second cluster includes processor 358, local memory subsystem 360, and co-processor cluster 362; and a third cluster includes processor 364.

Figure 3B:
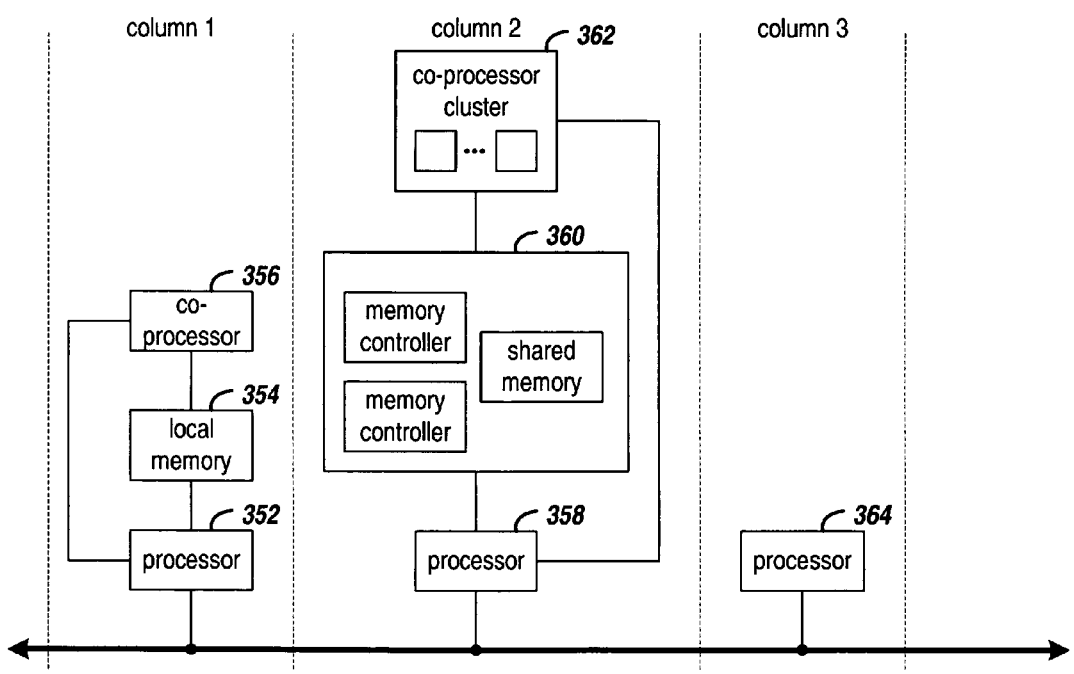
FIG. 3B shows an example graphical representation of an electrical circuit used by and resulting from the flow diagram of FIG. 3, according to an example embodiment of the present invention.

In selecting the column assignments, the master clusters may first be sorted using a comparison function. In one embodiment, the master clusters may be sorted according to the number of affiliates, and assigning the master clusters with the greatest numbers of affiliates to the center columns and assigning the master clusters with the fewest numbers of affiliates nearer the first and last columns. An example placement of master clusters and affiliates is shown in FIG. 3B, with the master cluster having the greatest number affiliates occupying the center column. As an alternative to or in combination with sorting of master clusters, the placement of the master clusters among the m columns may recognize modules that share connections between master clusters, for example, two processors with connections to a single memory controller. If this condition is recognized, the memory controller, (which would be considered to be its own cluster) would be placed between the two processors.

In the example embodiment, within each master cluster having a processor as the master, the processor is nearest the bus, the local memory subsystem is above the processor, and any co-processor or co-processor clusters are above the memory subsystems.

In assigning the slave clusters to columns, the slave clusters are also sorted. In one embodiment, the slave clusters are sorted by the number of slaves in the cluster. If the number of slave clusters is greater than the number of master clusters, then a suitable number of additional columns (beyond the m columns for the master clusters) are considered for placement of the slave clusters.

The slave clusters are processed in the sorted order (from greatest number of slaves to the least number of slaves in the clusters) for assignment to columns for display. Each of the slave clusters is assigned to a column as follows: If the slave cluster has only one bus master, then the slave cluster is assigned to the nearest, leftmost available column to the master. If the slave cluster has more than one bus master, then the slave cluster is assigned to the nearest, leftmost available column to the leftmost master. Once a slave cluster is assigned to a column, no further slave clusters may be assigned to that column. This approach for placing the slave clusters tends to assign each slave cluster below its corresponding master cluster if there is one-to-one relationship.

FIG. 3C shows an assignment of example slave clusters to columns. Slave cluster 372, 374, and 376 are to be assigned to columns in which the processors 378 and 380 have been previously assigned to columns 1 and 2, respectively.

Since there are only two bus masters (processor 378 and processor 380), only two columns were considered when the processors were assigned to columns 1 and 2. Thus, column 3 is added to accommodate the three slave clusters.

In the example, processor 378 is a master of slave cluster 372, processor 380 is a master of slave cluster 374, and processors 378 and 380 are masters of slave cluster 376.

Slave cluster 372 is assigned to a column first because it has the greatest number of slaves. Having processor 378 as its master, the slave cluster 372 is assigned to column 1, which is the nearest, leftmost available column to the master.

Slave cluster 374 is processed next in the sorted order of slave clusters. Processor 380 is the master of slave cluster 374, and the slave cluster is assigned to column 2, which is the nearest, leftmost available column of processor 380.

Slave cluster 376 is the last slave cluster and has both of processors 378 and 380 as masters. The leftmost, available column to the leftmost master (processors 378) is column 3, to which slave cluster 376 is assigned.

A miscellaneous cluster 384 is assigned to the rightmost column, and a column is added, for example, column 4, if the slave clusters are already assigned to the available columns.

Once all the objects have been assigned to columns, the widths of the columns and the heights of the bus area, master area, and slave area may be determined (step 306). The objects generally have sizes based on the number of ports on the object, with slave blocks having the same dimensions for ease of determining the dimensions of the enclosing slave cluster block.

In the example embodiment, the following rules are observed in determining the widths of the columns and heights of the bus, master, and slave areas. For each column, the width is constrained to be no smaller than the widths of the slave cluster and the master cluster of that column. The height of each of the bus, master, and slave areas is constrained to be no less than the height of each column in that area. In other words, the master cluster area must not be shorter than any master cluster and affiliates, and the slave cluster area must not be shorter than any slave cluster. With the widths of the columns and heights of the master, bus, and slave areas determined, the dimensions and placement of objects in the display can be expressed in terms of absolute coordinates. In an example embodiment, the objects are described in the Scalable Vector Graphics (SVG) language. The process described herein does not address zoom coordinates for determining a desirable aspect ratio for viewing the diagram.

Interconnection lines are generated based on the types and placement of the objects (FIG. 3, step 308). For the IO clusters, interconnect lines to the other objects are not generated in order to simplify readability of the resulting block diagram. Bus-to-bridge interconnections are represented with vertical lines as shown in FIG. 3A.

Within a master cluster, which includes a processor and its affiliates, the number of required routing channels is bounded by a small number (i.e., the point-to-point connections between the processor and co-processors), and can be practically pre-reserved. Since the number of connections can be determined from the design data and the desired width of connection lines to be arranged is known, space can be reserved for the connection lines between the processor and co-processors. Since the number of master ports of each master is also known in advance, the routing channels required for the master-to-bus connection can also be pre-reserved, and the routing is done deterministically. The master-to-bus connection is represented with a vertical line.

Similarly, the routing channel for each slave cluster can be pre-reserved and the routing can be done deterministically. No interconnection lines are generated for the miscellaneous cluster in order to simplify readability. To further simplify readability, additional connection information, such as clock nets and interrupt connections, may be described by additional text labels on the block symbols and their associated description table in text.

Once the objects have been placed, the sizes of the columns and areas determined, and the interconnection lines generated, the graphical description data may be saved for future reference (step 310). In addition, the graphical description data may be rendered for output to a display monitor (step 312).

Figure 4A:
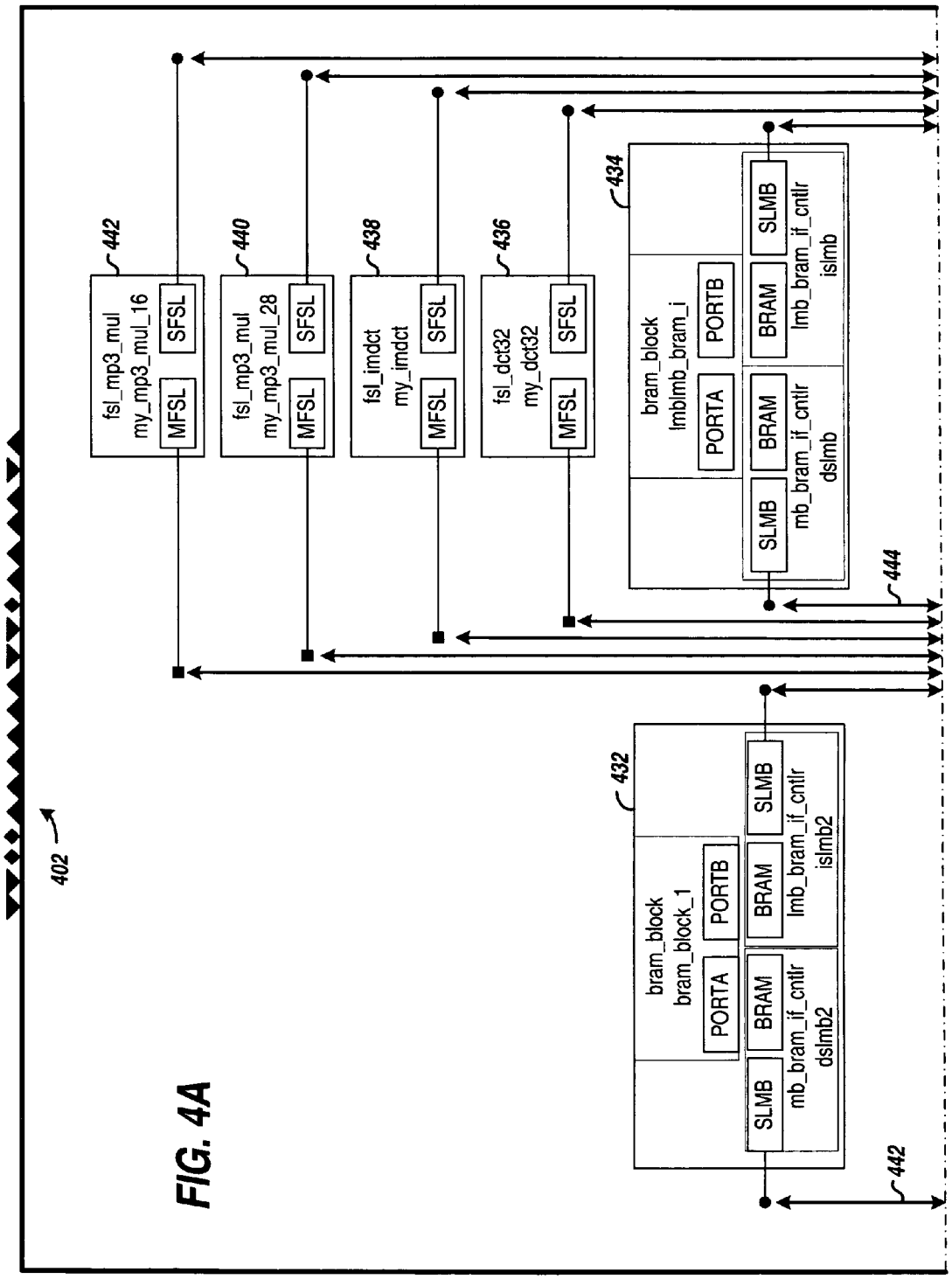
FIG. 4 shows the relationship between FIGS. 4A and 4B, which together show an example implementation of a graphical representation of an electrical circuit, according to an example embodiment of the present invention.
Figure 4B:
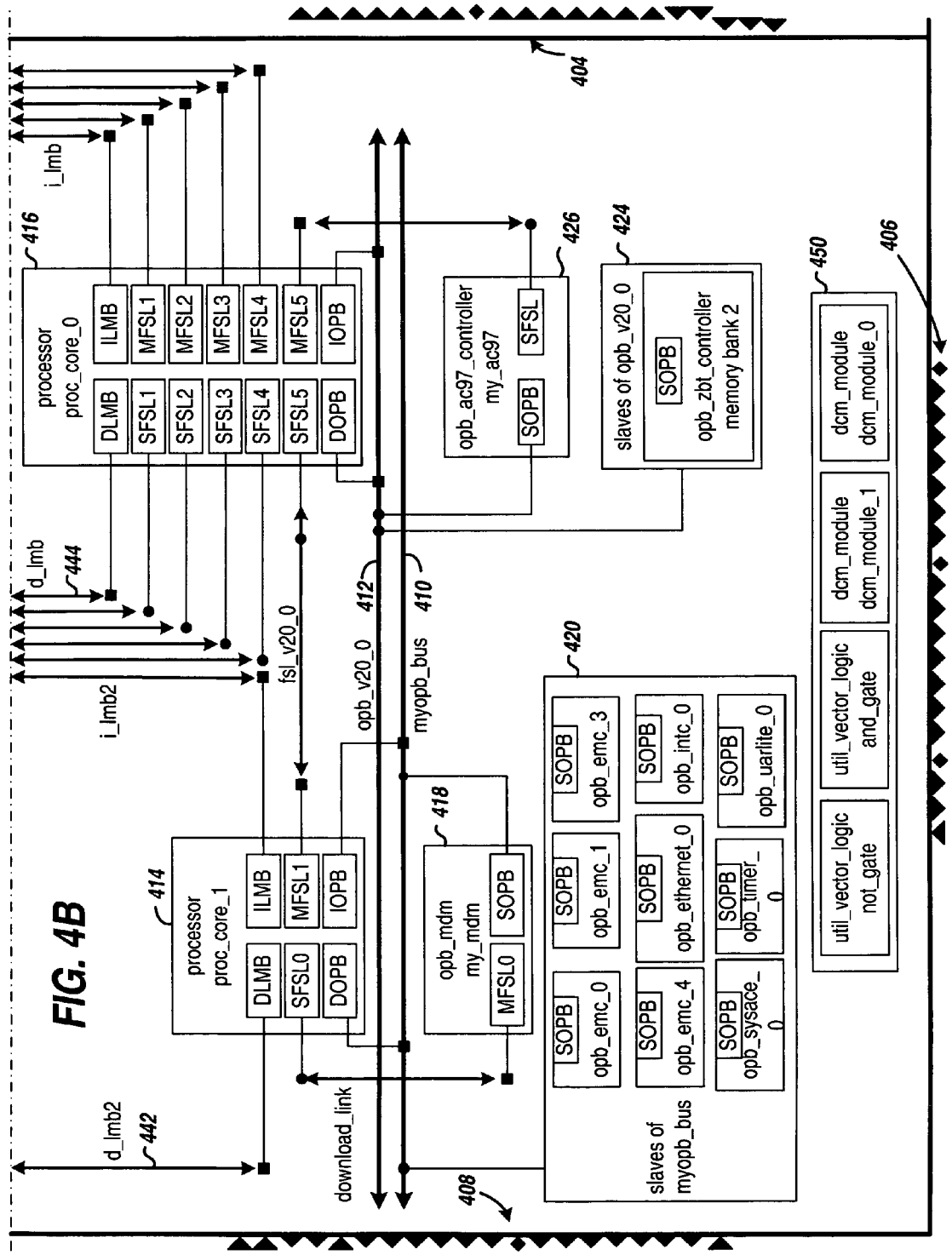

FIG. 4 shows the relationship between FIGS. 4A and 4B, which together form a block diagram of an electronic circuit design as generated from the example textual specification set forth in Appendix A. The example textual specification is generated by the Xilinx Platform Studio tool.

Each block in the textual description starts with "BEGIN" and is immediately followed by the name of the block. The description of a block is terminated with "END". Each block description indicates whether the block is a bus master or a bus slave. For example, the element named opb_intc includes the following bus interface definition "BUS_INTERFACE SOPB=myopb_bus". The name "SOPB" indicates the type of bus interface is slave, and "myobp_bus" is the name of the bus to which the block is connected.

In one embodiment, blocks are defined in terms of their bus connections. For example, slaves are elements that contain only slave connections to multi-master buses, masters are blocks that contain a master connection to a multi-master bus, and affiliates are blocks that contain connections to a master through a bus other than a multi-master bus (e.g., local memory bus).

External I/O ports are also defined at the beginning of the specification (e.g., PORT AC97_BIT_CLOCK_P=AC97_BIT_CLOCK_P, DIR=IN, SIGIS=CLK). The I/O ports are identified and divided into four subclusters for placement around the perimeter of the four sides of the block diagram. The I/O ports in sub-cluster 402 are on the top side, the I/O ports in sub-cluster 404 are on the right side, the I/O ports in sub-cluster 406 are on the bottom side, and the I/O ports in sub-cluster 408 are on the left side.

Multi-master buses 410 and 412 are centrally placed in the diagram, and masters of the multi-master buses, i.e., processors 414 and 416, are placed above the multi-master buses. Slaves 418, 420, 422, and 424 of the multi-master buses are generally placed below the multi-master buses.

Slaves having similar characteristics are grouped into a slave cluster. In one embodiment, slaves having the same bus connections are grouped into a slave cluster. Where possible, each slave cluster is placed below the master of the bus to which the slaves in the cluster are connected. An example placement method places first the slave clusters that have the greatest number of slaves. If there are more slave clusters than there are columns (e.g., more slave groups than there are masters) extra columns are created in the diagram and the slaves are placed within the extra columns.

Affiliates 432, 434, 436, 438, 440, and 440 of masters 414 and 416 are placed above the masters with which they are affiliated. However, the affiliate co-processor 418 is a slave on bus 410 in addition to having a point-to-point connection with processor 414. Generally, if there are any elements that have shared bus connections in addition to their co-processor bus connections, they are placed directly below the processor and above the slave bus cluster for the bus of which the processor is master.

Single master buses between a master and its affiliates are placed in the master area near the master to which they are connected. For example, d_lmb2 bus 442 is placed near master 414 and affiliate 432, and d_lmb bus 444 is placed near master 416 and affiliate 434.

Connection lines are used to show the connections between the various blocks and the buses. In one embodiment, the shape of the terminal end of a line indicates the type of connection. For example, connection lines from a master are terminated with a filled square, and connection lines from a slave are terminated with a filled circle.

Blocks that have no relationship to any of the multi-master buses may be grouped into a cluster of miscellaneous blocks. The cluster 450 of miscellaneous blocks is placed below the slaves in the diagram.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for translating a textual design description to a graphical representation. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

APPENDIX A

```
PARAMETER VERSION = 2.1.0
PORT AC97_BIT_CLOCK_P = AC97_BIT_CLOCKP, DIR = IN, SIGIS = CLK
PORT AC97_SDATA_IN = AC97_SDATA_IN, DIR = IN
PORT AC97_SDATA_OUT = AC97_SDATA_OUT, DIR = OUT
PORT AC97_SYNCH_P = AC97_SYNCH_P, DIR = OUT
PORT UART_Rx = UART_Rx, DIR = IN
PORT UART_Tx = UART_Tx, DIR = OUT
PORT ZBT_CLK_FB = ZBT_CLK_FB, DIR = IN
PORT ZBT_Clk_FBOut = ZBT_Clk_EBOut, DIR = OUT
PORT carrier_sense = carrier_sense, DIR = IN
PORT clk_27 = clk_27, DIR = IN, SIGIS = CLK
PORT clk_50 = clk_50, DIR = IN, SIGIS = CLK
PORT collision_detected = collision_detected, DIR = IN
PORT enet_slew_0 = net_gnd, DIR = OUT
PORT enet_slew_1 = net_gnd, DIR = OUT
PORT ext_reset = ext_reset, DIR = IN, SIGIS = RST
PORT mdc = mdc, DIR = INOUT
PORT mdinit = net_vcc, DIR = OUT
PORT mdio = mdio, DIR = INOUT
PORT memory_bank0_addr_p = memory_bank0_addr_p, VEC = [0:31], DIR = OUT
PORT memory_bank0_adv_Id_n = memory_bank0_adv_Id_n, DIR = OUT
PORT memory_bank0_cen_n = memory_bank0_cen_n, DIR = OUT
PORT memory_bank0_clk_p = zbt_Clk_100, DIR = OUT
PORT memory_bank0_clken_n = memory_bank0_clken_n, DIR = OUT
PORT memory_bank0_data = memory_bank0_data, VEC = [0:31], DIR = INOUT
PORT memory_bank0_oen_n = memory_bank0_oen_n, DIR = OUT
PORT memory_bank0_wen = memory_bank0_wen, VEC = [0:3], DIR = OUT
PORT memory_bank0_wen_n = memory_bank0_wen_n, DIR = OUT
PORT memory_bank1_addr_p = memory_bank1_addr_p, VEC = [0:31], DIR = OUT
PORT memory_bank1_adv_Id_n = memory_bank1_adv_Id_n, DIR = OUT
PORT memory_bank1_cen_n = memory_bank1_cen_n, DIR = OUT
PORT memory_bank1_clk_p = zbt_Clk_100, DIR = OUT
PORT memory_bank1_clken_n = memory_bank1_clken_n DIR = OUT
PORT memory_bank1_data = memory_bank1_data, VEC = [0:31], DIR = INOUT
PORT memory_bank1_oen_n = memory_bank1_oen_n, DIR = OUT
PORT memory_bank1_wen = memory_bank1_wen, VEC = [0:3], DIR = OUT
PORT memory_bank1_wen_n = memory_bank1_wen_n, DIR = OUT
PORT memory_bank2_addr_p = memory_bank2_addr_p, VEC = [0:18], DIR = OUT
PORT memory_bank2_adv_Id_n = memory_bank2_adv_Id_n, DIR = OUT
PORT memory_bank2_cen_n = memory_bank2_cen_n, DIR = OUT
PORT memory_bank2_clk_p = zbt_Clk_100, DIR = OUT
PORT memory_bank2_clken_n = memory_bank2_clken_n, DIR = OUT
PORT memory_bank2_data = memory_bank2_data, VEC = [0:31], DIR = INOUT
PORT memory_bank2_oen_n = memory_bank2_oen_n, DIR = OUT
PORT memory_bank2_wen = memory_bank2_wen, VEC = [1:4], DIR = OUT
PORT memory_bank2_wen_n = memory_bank2_wen_n, DIR = OUT
PORT memory_bank3_addr_p = memory_bank3_addr_p, VEC = [0:31], DIR = OUT
PORT memory_bank3_adv_Id_n = memory_bank3_adv_Id_n, DIR = OUT
PORT memory_bank3_cen_n = memory_bank3_cen_n, DIR = OUT
PORT memory_bank3_clk_p = zbt_Clk_100, DIR = OUT
PORT memory_bank3_clken_n = memory_bank3_clken_n, DIR = OUT
PORT memory_bank3_data = memory_bank3_data, VEC = [0:31], DIR = INOUT
PORT memory_bank3_oen_n = memory_bank3_oen_n, DIR = OUT
PORT memory_bank3_wen = memory_bank3_wen, VEC = [0:3], DIR = OUT
PORT memory_bank3_wen_n = memory_bank3_wen_n, DIR = OUT
PORT memory_bank4_addr_p = memory_bank4_addr_p, VEC = [0:31], DIR = OUT
PORT memory_bank4_adv_Id_n = memory_bank4_adv_Id_n, DIR = OUT
PORT memory_bank4_cen_n = memory_bank4_cen_n, DIR = OUT
PORT memory_bank4_clk_p = zbt_Clk_100, DIR = OUT
PORT memory_bank4_clken_n = memory_bank4_clken_n, DIR = OUT
PORT memory_bank4_data = memory_bank4_data, VEG = [0:31], DIR = INOUT
PORT memory_bank4_oen_n = memory_bank4_oen_n, DIR = OUT
PORT memory_bank4_wen = memory_bank4_wen, VEC = [0:3], DIR = OUT
PORT memory_bank4_wen_n = memory_bank4_wen_n, DIR = OUT
PORT mpa = mpa, VEC = [6:0], DIR = OUT
```

APPENDIX A

```
PORT mpce_n = mpce_n, DIR = OUT
PORT mpd = mpd, VEC = [15:0], DIR = INOUT
PORT mpirq = mpirq, DIR = IN
PORT mpoe_n = mpoe_n, DIR = OUT
PORT mpwe_n = mpwe_n, DIR = OUT
PORT pause = net_gnd, DIR = OUT
PORT rx_clock = rx_clock, DIR = IN, SIGIS = CLK
PORT rx_data = rx_data, VEC = [3:0], DIR = IN
PORT rx_data_valid = rx_data_valid, DIR = IN
PORT rx_error = rx_error, DIR = IN
PORT startup = util_vector_logic_0_Res, DIR = OUT
PORT tx_clock = tx_clock, DIR = IN, SIGIS = CLK
PORT tx_data = tx_data, VEC = [3:0], DIR = OUT
PORT tx_enable = tx_enable, DIR = OUT
PORT tx_error = tx_error, DIR = OUT
BEGIN proc_core
 PARAMETER INSTANCE = proc_core_1
 PARAMETER HW_VER = 3.00.a
 PARAMETER C_USE_BARREL = 1
 PARAMETER C_USE_DIV = 1
 PARAMETER C_DEBUG_ENABLED = 1
 PARAMETER C_NUMBER_OF_PC_BRK = 2
 PARAMETER C_NUMBER_OF_RD_ADDR_BRK = 1
 PARAMETER C_NUMBER_OF_WR_ADDR_BRK = 1
 PARAMETER C_FSL_LINKS = 2
 PARAMETER C_USE_ICACHE = 1
 PARAMETER C_ADDR_TAG_BITS = 10
 PARAMETER C_USE_DCACHE = 1
 PARAMETER C_DCACHE_ADDR_TAG = 10
 PARAMETER C_ICACHE_BASEADDR = 0x80000000
 PARAMETER C_ICACHE_HIGHADDR = 0x807FFFFF
 PARAMETER C_DCACHE_BASEADDR = 0x80000000
 PARAMETER C_DCACHE_HIGHADDR = 0x807FFFFF
 BUS_INTERFACE SFSL0 = download_link
 BUS_INTERFACE MFSL1 = fsl_v20_0
 BUS_INTERFACE DLMB = d_lmb2
 BUS_INTERFACE ILMB = i_lmb2
 BUS_INTERFACE DOPB = myopb_bus
 BUS_INTERFACE IOPB = myopb_bus
 PORT DBG_UPDATE = MB0_DBG_UPDATE
 PORT INTERRUPT = proc_core_1_INTERRUPT
 PORT CLK = sys_clk
 PORT DBG_CLK = MB0_DBG_CLK
 PORT DBG_REG_EN = MB0_DBG_REG_EN
 PORT DBG_CAPTURE = MB0_DBG_CAPTURE
 PORT DBG_TDO = MB0_DBG_TDO
 PORT DBG_TDI = MB0_DBG_TDI
END
BEGIN opb_uartlite
 PARAMETER INSTANCE = opb_uartlite_0
 PARAMETER HW_VER = 1.00.b
 PARAMETER C_BASEADDR = 0xFFFF8000
 PARAMETER C_HIGHADDR = 0xFFFF80FF
 PARAMETER C_CLK_FREQ = 66_666_666
 PARAMETER C_BAUDRATE = 57600
 PARAMETER C_USE_PARITY = 0
 BUS_INTERFACE SOPB = myopb_bus
 PORT TX = UART_Tx
 PORT RX = UART_Rx
 PORT Interrupt = opb_uartlite_0_Interrupt
 PORT OPB_Clk = sys_clk
END
BEGIN opb_timer
 PARAMETER INSTANCE = opb_timer_0
 PARAMETER HW_VER = 1.00.b
 PARAMETER C_BASEADDR = 0xFFFF8100
 PARAMETER C_HIGHADDR = 0xffff81ff
 PARAMETER C_ONE_TIMER_ONLY = 1
 BUS_INTERFACE SOPB = myopb_bus
 PORT Interrupt = opb_timer_0_Interrupt
 PORT OPB_Clk = sys_clk
END
BEGIN opb_sysace
 PARAMETER INSTANCE = opb_sysace_0
 PARAMETER HW_VER = 1.00.b
 PARAMETER C_BASEADDR = 0xFFFF8300
 PARAMETER C_HIGHADDR = 0xFFFF83FF
```

APPENDIX A

```
BUS_INTERFACE SOPB = myopb_bus
PORT OPB_Clk = sys_clk
PORT SysACE_CLK = clk_27
PORT SysACE_MPA = mpa
PORT SysACE_CEN = mpce_n
PORT SysACE_MPIRQ = mpirq
PORT SysACE_IRQ = opb_sysace_0_SysACE_IRQ
PORT SysACE_MPD = mpd
PORT SysACE_WEN = mpwe_n
PORT SysACE_OEN = mpoe_n
END
BEGIN opb_intc
 PARAMETER INSTANCE = opb_intc_0
 PARAMETER HW_VER = 1.00.c
 PARAMETER C_BASEADDR = 0xFFFF8200
 PARAMETER C_HIGHADDR = 0xffff82ff
 BUS_INTERFACE SOPB = myopb_bus
 PORT Irq = proc_core_1_INTERRUPT
 PORT OPB_Clk = sys_clk
 PORT Intr = opb_sysace_0_SysACE_IRQ & opb_time_0_Interrupt &
opb_uartlite_0_Interrupt & opb_ethernet_0_IP2INTC_Irpt
END
BEGIN opb_ethernet
 PARAMETER INSTANCE = opb_ethernet_0
 PARAMETER HW_VER = 1.00.m
 PARAMETER C_BASEADDR = 0xFFFE0000
 PARAMETER C_HIGHADDR = 0xFFFE3FFF
 PARAMETER C_OPB_CLK_PERIOD_PS = 15000
 BUS_INTERFACE SOPB = myopb_bus
 PORT PHY_rx_er = rx_error
 PORT PHY_rx_clk = rx_clock
 PORT PHY_Mii_data = mdio
 PORT Freeze = net_gnd
 PORT PHY_tx_en = tx_enable
 PORT PHY_Mii_clk = mdc
 PORT PHY_crs = carrier_sense
 PORT PHY_dv = rx_data_valid
 PORT OPB_Clk = sys_clk
 PORT PHY_col = collision_detected
 PORT PHY_tx_clk = tx_clock
 PORT IP2INTC_Irpt = opb_ethernet_0_IP2INTC_Irpt
 PORT PHY_tx_er = tx_error
 PORT PHY_tx_data = tx_data
 PORT PHY_rx_data = rx_data
END
BEGIN opb_emc
 PARAMETER INSTANCE = opb_emc_1
 PARAMETER HW_VER = 1.10.b
 PARAMETER C_OPB_CLK_PERIOD_PS = 15000
 PARAMETER C_DEV_MIR_ENABLE = 0
 PARAMETER C_DEV_BLK_ID = 0
 PARAMETER C_SYNCH_MEM_0 = 1
 PARAMETER C_BASEADDR = 0xFFFF5200
 PARAMETER C_HIGHADDR = 0xffff53ff
 PARAMETER C_MEM0_BASEADDR = 0x80200000
 PARAMETER C_MEM0_HIGHADDR = 0x803fffff
 BUS_INTERFACE SOPB = myopb_bus
 PORT Mem_CEN = memory_bank1_cen_n
 PORT Mem_BEN = memory_bank1_wen
 PORT Mem_OEN = memory_bank1_oen_n
 PORT Mem_A = memory_bank1_addr_p
 PORT OPB_Clk = sys_clk
 PORT Mem_CKEN = memory_bank1_clken_n
 PORT Mem_ADV_LDN = memory_bank1_adv_ld_n
 PORT Mem_DQ = memory_bank1_data
 PORT Mem_RNW = memory_bank1_wen_n
END
BEGIN opb_emc
 PARAMETER INSTANCE = opb_emc_3
 PARAMETER HW_VER = 1.10.b
 PARAMETER C_OPB_CLK_PERIOD_PS = 15000
 PARAMETER C_DEV_MIR_ENABLE = 0
 PARAMETER C_DEV_BLK_ID = 0
 PARAMETER C_SYNCH_MEM_0 = 1
 PARAMETER C_BASEADDR = 0xFFFF5400
 PARAMETER C_HIGHADDR = 0xffff55ff
 PARAMETER C_MEM0_BASEADDR = 0x80400000
```

-continued

APPENDIX A

```
PARAMETER C_MEM0_HIGHADDR = 0x805fffff
BUS_INTERFACE SOPB = myopb_bus
PORT Mem_CEN = memory_bank3_cen_n
PORT Mem_BEN = memory_bank3_wen
PORT Mem_OEN = memory_bank3_oen_n
PORT Mem_A = memory_bank3_addr_p
PORT OPB_Clk = sys_clk
PORT Mem_CKEN = memory_bank3_clken_n
PORT Mem_ADV_LDN = memory_bank3_adv_ld_n
PORT Mem_DQ = memory_bank3_data
PORT Mem_RNW = memory_bank3_wen_n
END
BEGIN opb_emc
 PARAMETER INSTANCE = opb_emc_4
 PARAMETER HW_VER = 1.10.b
 PARAMETER C_OPB_CLK_PERIOD_PS = 15000
 PARAMETER C_DEV_MIR_ENABLE = 0
 PARAMETER C_DEV_BLK_ID = 0
 PARAMETER C_SYNCH_MEM_0 = 1
 PARAMETER C_BASEADDR = 0xFFFF5600
 PARAMETER C_HIGHADDR = 0xffff57ff
 PARAMETER C_MEM0_BASEADDR = 0x80600000
 PARAMETER C_MEM0_HIGHADDR = 0x807fffff
 BUS_INTERFACE SOPB = myopb_bus
 PORT Mem_CEN = memory_bank4_cen_n
 PORT Mem_BEN = memory_bank4_wen
 PORT Mem_OEN = memory_bank4_oen_n
 PORT Mem_A = memory_bank4_addr_p
 PORT OPB_Clk = sys_clk
 PORT Mem_CKEN = memory_bank4_clken_n
 PORT Mem_ADV_LDN = memory_bank4_adv_ld_n
 PORT Mem_DQ = memory_bank4_data
 PORT Mem_RNW = memory_bank4_wen_n
END
BEGIN opb_emc
 PARAMETER INSTANCE = opb_emc_0
 PARAMETER HW_VER = 1.10.b
 PARAMETER C_OPB_CLK_PERIOD_PS = 15000
 PARAMETER C_DEV_MIR_ENABLE = 0
 PARAMETER C_DEV_BLK_ID = 0
 PARAMETER C_SYNCH_MEM_0 = 1
 PARAMETER C_BASEADDR = 0xFFFF5000
 PARAMETER C_HIGHADDR = 0xffff51ff
 PARAMETER C_MEM0_BASEADDR = 0x80000000
 PARAMETER C_MEM0_HIGHADDR = 0x801fffff
 BUS_INTERFACE SOPB = myopb_bus
 PORT Mem_CEN = memory_bank0_cen_n
 PORT Mem_BEN = memory_bank0_wen
 PORT Mem_OEN = memory_bank0_oen_n
 PORT Mem_A = memory_bank0_addr_p
 PORT OPB_Clk = sys_clk
 PORT Mem_CKEN = memory_bank0_clken_n
 PORT Mem_ADV_LDN = memory_bank0_adv_ld_n
 PORT Mem_RNW = memory_bank0_wen_n
 PORT Mem_DQ = memory_bank0_data
END
BEGIN util_vector_logic
 PARAMETER INSTANCE = no_gate
 PARAMETER HW_VER = 1.00.a
 PARAMETER C_OPERATION = not
 PARAMETER C_SIZE = 1
 PORT Op1 = util_vector_logic_0_Res
 PORT Res = fpga_reset
END
BEGIN opb_v20
 PARAMETER INSTANCE = myopb_bus
 PARAMETER HW_VER = 1.10.b
 PORT OPB_Clk = sys_clk
 PORT SYS_Rst = fpga_reset
END
BEGIN opb_mdm
 PARAMETER INSTANCE = my_mdm
 PARAMETER HW_VER = 2.00.a
 PARAMETER C_MB_DBG_PORTS = 1
 PARAMETER C_USE_UART = 0
 PARAMETER C_UART_WIDTH = 8
 PARAMETER C_BASEADDR = 0xFFFF4000
```

-continued

APPENDIX A

```
PARAMETER C_HIGHADDR = 0xFFFF40FF
PARAMETER C_WRITE_FSL_PORTS = 1
BUS_INTERFACE MESL0 = download_link
BUS_INTERFACE SOPB = myopb_bus
PORT DBG_CLK_0 = MB0_DBG_CLK
PORT DBG_UPDATE_0 = MB0_DBG_UPDATE
PORT DBG_TDI_0 = MB0_DBG_TDI
PORT OPB_CLK = sys_clk
PORT DBG_CAPTURE_0 = MB0_DBG_CAPTURE
PORT DBG_REG_EN_0 = MB0_DBG_REG_EN
PORT DBG_TDO_0 = MB0_DBG_TDO
END
BEGIN proc_core
 PARAMETER INSTANCE = proc_core_0
 PARAMETER HW_VER = 3.00.a
 PARAMETER C_USE_BARREL = 1
 PARAMETER C_FSL_LINKS = 7
 PARAMETER C_USE_DIV = 1
 PARAMETER C_USE_ICACHE = 1
 PARAMETER C_ICACHE_BASEADDR = 0x80000000
 PARAMETER C_ICACHE_HIGHADDR = 0x801FFFFF
 PARAMETER C_ADDR_TAG_BITS = 8
 BUS_INTERFACE SFSL1 = fsl_v20_0
 BUS_INTERFACE DLMB = d_lmb
 BUS_INTERFACE ILMB = i_lmb
 BUS_INTERFACE DOPB = myopb_bus
 BUS_INTERFACE IOPB = myopb_bus
 PORT CLK = sys_clk
END
BEGIN bram_block
 PARAMETER INSTANCE = lmblmb_bram_i
 PARAMETER HW_VER = 1.00.a
 BUS_INTERFACE PORTA = ilmb_porta
 BUS_INTERFACE PORTB = dlmb_portb
END
BEGIN lmb_bram_if_cntlr
 PARAMETER INSTANCE = islmb2
 PARAMETER HW_VER = 1.00.b
 PARAMETER C_BASEADDR = 0x00000000
 PARAMETER C_HIGHADDR = 0x00007fff
 BUS_INTERFACE SLMB = i_lmb2
 BUS_INTERFACE BRAM_PORT = conn_2
END
BEGIN lmb_bram_if_cntlr
 PARAMETER INSTANCE = islmb
 PARAMETER HW_VER = 1.00.b
 PARAMETER C_BASEADDR = 0x00000000
 PARAMETER C_HIGHADDR = 0x00001FFF
 BUS_INTERFACE SLMB = i_lmb
 BUS_INTERFACE BRAM_PORT = ilmb_porta
END
BEGIN lmb_v10
 PARAMETER INSTANCE = i_lmb2
 PARAMETER HW_VER = 1.00.a
 PORT LMB_Clk = sys_clk
 PORT SYS_Rst = fpga_reset
END
BEGIN lmb_v10
 PARAMETER INSTANCE = i_lmb
 PARAMETER HW_VER = 1.00.a
 PORT LMB_Clk = sys_clk
 PORT SYS_Rst = fpga_reset
END
BEGIN lmb_bram_if_cntlr
 PARAMETER INSTANCE = dslmb2
 PARAMETER HW_VER = 1.00.b
 PARAMETER C_BASEADDR = 0x00000000
 PARAMETER C_HIGHADDR = 0x00007fff
 BUS_INTERFACE SLMB = d_lmb2
 BUS_INTERFACE BRAM_PORT = conn_3
END
BEGIN lmb_bram_if_cntlr
 PARAMETER INSTANCE = dslmb
 PARAMETER HW_VER = 1.00.b
 PARAMETER C_BASEADDR = 0x00000000
 PARAMETER C_HIGHADDR = 0x00001FFF
 BUS_INTERFACE SLMB = d_lmb
```

-continued

APPENDIX A

```
 BUS_INTERFACE BRAM_PORT = dlmb_portb
END
BEGIN fsl_v20
 PARAMETER INSTANCE = download_link
 PARAMETER HW_VER = 1.00.b
 PORT SYS_Rst = fpga_reset
 PORT FSL_Clk = sys_clk
END
BEGIN dcm_module
 PARAMETER INSTANCE = dcm_module_1
 PARAMETER HW_VER = 1.00.a
 PARAMETER C_CLKIN_PERIOD = 20.00000
 PARAMETER C_CLKFX_BUF = TRUE
 PARAMETER C_CLKFX_MULTIPLY = 4
 PARAMETER C_CLKFX_DIVIDE = 3
 PARAMETER C_CLK0_BUF = TRUE
 PARAMETER C_CLKFB_BUF = TRUE
 PORT CLKIN = clk_50
 PORT CLK0 = ZBT_Clk_FBOut
 PORT CLKFB = ZBT_CLK_FB
 PORT CLKFX = zbt_Clk_100
 PORT LOCKED = dcm_module_1_LOCKED
 PORT RST = ext_reset
END
BEGIN dcm_module
 PARAMETER INSTANCE = dcm_module_0
 PARAMETER HW_VER = 1.00.a
 PARAMETER C_CLKIN_PERIOD = 20.00000
 PARAMETER C_CLKFX_BUF = TRUE
 PARAMETER C_CLKFX_MULTIPLY = 4
 PARAMETER C_CLKFX_DIVIDE = 3
 PORT LOCKED = dcm_module_0_LOCKED
 PORT RST = ext_reset
 PORT CLKIN = clk_50
 PORT CLK0 = sys_clk_fb
 PORT CLKFX = sys_clk
 PORT CLKFB = sys_clk_fb
END
BEGIN lmb_v10
 PARAMETER INSTANCE = d_lmb2
 PARAMETER HW_VER = 1.00.a
 PORT LMB_Clk = sys_clk
 PORT SYS_Rst = fpga_reset
END
BEGIN lmb_v10
 PARAMETER INSTANCE = d_lmb
 PARAMETER HW_VER = 1.00.a
 PORT SYS_Rst = fpga_reset
 PORT LMB_Clk = sys_clk
END
BEGIN bram_block
 PARAMETER INSTANCE = bram_block_1
 PARAMETER HW_VER = 1.00.a
 BUS_INTERFACE PORTA = conn_2
 BUS_INTERFACE PORTB = conn_3
END
BEGIN util_vector_logic
 PARAMETER INSTANCE = and_gate
 PARAMETER HW_VER = 1.00.a
 PARAMETER C_SIZE = 1
 PORT Op1 = dcm_module_0_LOCKED
 PORT Res = util_vector_logic_0_Res
 PORT Op2 = dcm_module_1_LOCKED
END
BEGIN fsl_v20
 PARAMETER INSTANCE = fsl_v20_0
 PARAMETER HW_VER = 1.00.b
 PARAMETER C_FSL_DEPTH = 4096
 PARAMETER C_USE_CONTROL = 0
 PORT FSL_Clk = sys_clk
 PORT SYS_Rst = fpga_reset
    END
```

What is claimed is:

1. A processor-implemented method for generating a block diagram of an electronic circuit design, comprising:
identifying by a processor from an input textual description of the electronic circuit design, each multi-master bus, bus master of a multi-master bus, bus slave of a multi-master bus, memory, co-processor and input/output port;
representing in a memory coupled to the processor, diagrammatic placement of each input/output port about a perimeter of a first area;
representing in the memory, a bus area, a master area, and a slave area within the first area;
representing in the memory, placement in the bus area of each multi-master bus;
representing in the memory, placement in the master area of each bus master, wherein no bus master is placed between another bus master and a multi-master bus;
representing in the memory, a group of bus slaves of a multi-master bus, wherein each bus slave in the group has a slave connection to the multi-master bus and no other connection to any bus master of the multi-master bus;
representing in the memory, placement of the group of bus slaves as a single block in the bus area, wherein the group is diagrammatically aligned with a bus master of the multi-master bus to which the group of bus slaves is connected;
representing in the memory, connections between each multi-master bus and each bus master of the multi-master bus and a connection between the multi-master bus and the group of bus slaves with respective connection lines; and
outputting a diagrammatic representation consistent with the representations of the placement of each identified multi-master bus, bus master, bus slave, and connections.

2. The method of claim 1, wherein the bus area is between the master area and the slave area.

3. The method of claim 2, wherein the master area is above the bus area.

4. The method of claim 2, further comprising:
identifying by the processor from the input textual description of the electronic circuit design, each memory block and each co-processor;
associating with each bus master that specifies a processor, each memory block that is local to the bus master and each co-processor of the processor; and
representing in the memory, placement of each memory block and each co-processor that is associated with a bus master, wherein the placement of the memory block and the co-processor is aligned with the associated bus master.

5. The method of claim 4, wherein for placement of each memory block and each co-processor that is associated with a bus master, the bus master is between the bus area and the memory block and the co-processor.

6. The method of claim 5, wherein placement of each memory block that is associated with a bus master is above placement of the bus master in the master area.

7. The method of claim 6, wherein placement of each co-processor associated with the bus master is above placement of each memory block associated with the bus master.

8. The method of claim 5, further comprising:
determining for each bus master, a respective total number of associated memory blocks and co-processors; and
determining placement of identified bus masters in order from a bus master with a greatest number of associated memory blocks and co-processors to a bus master with a least number of associated memory blocks and co-processors.

9. The method of claim 6, wherein placement of the bus master with the greatest number of associated memory blocks and co-processors is centered in the master area.

10. The method of claim 1, further comprising:
identifying by the processor from an input textual description of the electronic circuit design, each bridge between a pair of multi-master buses;
representing in the memory, placement in the bus area of each bridge; and
representing in the memory, connections between each bridge and the pair of multi-master buses with connection lines; and
wherein the outputting of the diagrammatic representation includes each bridge and the connections between the bridge to the pair of multi-master buses.

11. The method of claim 10, wherein placement of each bridge is directly below one multi-master bus of the pair of multi-master buses to which the bridge has a slave connection.

12. The method of claim 10, further comprising:
identifying by the processor from an input textual description of the electronic circuit design, each miscellaneous design block having no connections to any multi-master bus;
representing in the memory, placement in the slave area of each miscellaneous design block as a single block including each miscellaneous design block without connection lines; and
wherein the outputting of the diagrammatic representation includes the single block including each miscellaneous design block.

13. The method of claim 12, wherein placement of the single block is below each group of bus slaves.

14. The method of claim 12, wherein the bus area is between the master area and the slave area.

15. The method of claim 14, further comprising:
identifying by the processor from the input textual description of the electronic circuit design, each memory block and each co-processor;
associating with each bus master that specifies a processor, each memory block that is local to the bus master and each co-processor of the processor; and
representing in the memory, placement of each memory block and each co-processor that is associated with the bus master, wherein the placement of the memory block and the co-processor is aligned with the associated bus master.

16. The method of claim 15, further comprising:
determining for each bus master, a respective total number of associated memory blocks and co-processors; and
determining placement of identified bus masters in order from a bus master with a greatest number of associated memory blocks and co-processors to a bus master with a least number of associated memory blocks and co-processors.

17. The method of claim 16, wherein placement of the bus master with the greatest number of associated memory blocks and co-processors is centered in the master area.

18. The method of claim 17, wherein placement of each memory block that is associated with a bus master is above placement of the bus master in the master area, and placement of each co-processor associated with the bus master is above placement of each memory block associated with the bus master.

19. An apparatus for generating a block diagram of an electronic circuit design, comprising:
- means for identifying from an input textual description of the electronic circuit design, each multi-master bus, bus master of a multi-master bus, bus slave of a multi-master bus, and input/output port;
- means for representing diagrammatic placement of each input/output port about a perimeter of a first area;
- means for representing a bus area, a master area, and a slave area within the first area;
- means for representing in the memory, placement in the bus area of each multi-master bus;
- means for representing placement in the master area of each bus master of a multi-master bus, wherein no bus master is placed between another bus master and a multi-master bus;
- means for representing a group of bus slaves of a multi-master bus, wherein each bus slave in the group has a slave connection to the multi-master bus and no other connection to any bus master of the multi-master bus;
- means for representing placement of the group of bus slaves as a single block in the bus area, wherein the group is diagrammatically aligned with a bus master of the multi-master bus to which the group of bus slaves is connected;
- means for representing connections between each multi-master bus and each bus master of the multi-master bus and a connection between the multi-master bus and the group of bus slaves with connection lines; and
- means for outputting a diagrammatic representation consistent with the representations of the placement of each identified multi-master bus, bus master, bus slave, and connections.

20. An article of manufacture, comprising:
a processor-readable medium configured with instructions executable by a processor for generating a block diagram of an electronic circuit design by performing steps including,
- identifying by the processor from an input textual description of the electronic circuit design, each multi-master bus, bus master of a multi-master bus, bus slave of a multi-master bus, and input/output port;
- representing in a memory coupled to the processor, diagrammatic placement of each input/output port about a perimeter of a first area;
- representing in the memory, a bus area, a master area, and a slave area within the first area;
- representing in the memory, placement in the bus area of each multi-master bus;
- representing in the memory, placement in the master area of each bus master of a multi-master bus, wherein no bus master is placed between another bus master and a multi-master bus;
- representing in the memory, a group of bus slaves of a multi-master bus, wherein each bus slave in the group has a slave connection to the multi-master bus and no other connection to any bus master of the multi-master bus;
- representing in the memory, placement of the group of bus slaves as a single block in the bus area, wherein the group is diagrammatically aligned with a bus master of the multi-master bus to which the group of bus slaves is connected;
- representing in the memory, connections between each multi-master bus and each bus master of the multi-master bus and a connection between the multi-master bus and the group of bus slaves with respective connection lines; and
- outputting a diagrammatic representation consistent with the representations of the placement of each identified multi-master bus, bus master, bus slave, and connections.

\* \* \* \* \*